(12) United States Patent
Kim et al.

(10) Patent No.: US 7,897,504 B2
(45) Date of Patent: Mar. 1, 2011

(54) METHOD FOR FABRICATING SEMICONDUCTOR DEVICE

(75) Inventors: Jung Geun Kim, Seoul (KR); Cheol Mo Jeong, Icheon-si (KR); Whee Won Cho, Chungcheongbuk-do (KR); Seong Hwan Myung, Kyeongki-Do (KR)

(73) Assignee: Hynix Semiconductor Inc., Icheon-si (KR)

( * ) Notice: Subject to any disclaimer, the term of this patent is extended or adjusted under 35 U.S.C. 154(b) by 559 days.

(21) Appl. No.: 11/747,444

(22) Filed: May 11, 2007

(65) Prior Publication Data

US 2008/0081465 A1    Apr. 3, 2008

(30) Foreign Application Priority Data

Sep. 29, 2006    (KR) .................... 10-2006-0096199

(51) Int. Cl.
*H01L 21/4763* (2006.01)
(52) U.S. Cl. .................... 438/623; 438/694; 438/725; 438/780; 438/781
(58) Field of Classification Search ................ 438/694, 438/623, 725, 780, 781
See application file for complete search history.

(56) References Cited

U.S. PATENT DOCUMENTS

| | | | | |
|---|---|---|---|---|
| 5,250,451 A * | 10/1993 | Chouan | ...................... | 438/161 |
| 5,801,399 A * | 9/1998 | Hattori et al. | ................. | 257/69 |
| 6,653,735 B1 * | 11/2003 | Yang et al. | .................. | 257/758 |
| 6,864,556 B1 * | 3/2005 | You et al. | ................... | 257/437 |
| 6,884,733 B1 * | 4/2005 | Dakshina-Murthy et al. | ..... | 438/717 |
| 7,074,706 B2 * | 7/2006 | Aoyama et al. | ............. | 438/619 |
| 7,084,071 B1 * | 8/2006 | Dakshina-Murthy et al. | ..... | 438/717 |
| 7,164,163 B2 * | 1/2007 | Chen et al. | ................... | 257/288 |
| 7,312,148 B2 * | 12/2007 | Ramaswamy et al. | ....... | 438/660 |
| 7,314,540 B2 * | 1/2008 | Seki et al. | ................... | 204/294 |
| 7,396,718 B2 * | 7/2008 | Frohberg et al. | ........... | 438/233 |
| 7,442,601 B2 * | 10/2008 | Pei et al. | .................... | 438/218 |
| 7,521,304 B1 * | 4/2009 | Huang et al. | ................ | 438/197 |
| 2002/0060362 A1 * | 5/2002 | Miyamoto | .................. | 257/751 |
| 2006/0170058 A1 * | 8/2006 | Chiang et al. | .............. | 257/369 |
| 2006/0183339 A1 * | 8/2006 | Ravi et al. | ................... | 438/758 |
| 2006/0264060 A1 * | 11/2006 | Ramaswamy et al. | ....... | 438/758 |
| 2007/0200179 A1 * | 8/2007 | Chen | .......................... | 257/369 |
| 2008/0057681 A1 * | 3/2008 | Parihar et al. | ............... | 438/510 |

FOREIGN PATENT DOCUMENTS

JP    03-190128    8/1991
KR    10-2001-0065175    7/2001

* cited by examiner

*Primary Examiner*—Matthew S Smith
*Assistant Examiner*—John M Parker
(74) *Attorney, Agent, or Firm*—Marshall, Gerstein & Borun LLP

(57) ABSTRACT

A method for fabricating a semiconductor device, in which a lifting phenomenon can be prevented from occurring in forming an amorphous carbon film on an etched layer having tensile stress. According to the invention, since a compression stress on the etched layer or the amorphous carbon film can be reduced or a compression stress film is formed between the etched layer or the amorphous carbon film to prevent a lifting phenomenon from occurring and thus another pattern can be formed to fabricate a highly integrated semiconductor device.

6 Claims, 2 Drawing Sheets

METHOD FOR FABRICATING SEMICONDUCTOR DEVICE

CROSS-REFERENCE TO RELATED APPLICATION

The priority of Korean patent application number 10-2006-96199, filed on Sep. 29, 2006, the disclosure of which is incorporated by reference in its entirety, is claimed.

BACKGROUND OF THE INVENTION

The invention relates to a method for fabricating a semiconductor device and, more particularly, to a method for fabricating a semiconductor device in which a lifting phenomenon can be prevented from occurring in forming an amorphous carbon film on an etched layer having tensile stress.

As semiconductor devices have become more highly integrated, the devices have to be formed in a high density on a predetermined cell area and therefore unit devices such as a transistors and capacitors, etc. decrease in size. In particular, as a design rule decreases in a memory device such as a flash memory, semiconductor devices that are formed inside cells decrease generally in size. Recently, a minimum line width of a flash memory device is formed equal to or less than 0.1 µm, and further as required to be equal to or less than 60 nm. Therefore, several problems arise in fabricating semiconductor devices forming a cell and various solutions has been tried to solve the aforementioned problems.

In particular, as to a step of forming a pattern of metal wire, etc., in the prior art, a reflection preventing film was formed of SiON, etc., and a hard mask was formed of a nitride film such as SiN, etc., and then a photolithography process was performed using such resulting films. However, there is a limitation to the step of fabricating a semiconductor device having a minute line width equal to or less than 60 nm. As a result, a solution has been proposed, in which a reflection preventing film and a hard mask are formed at the same time using a amorphous carbon film and photolithography is performed in order to form a minute pattern in fabricating a semiconductor device having a line width equal to or less than 60 nm.

However, when the reflection preventing film and the hard mask are formed using a amorphous carbon film, a problem arises in that a lifting phenomenon occurs, which does not occur in forming the reflection preventing film and the hard mask using SiON and SiN.

Here, this lifting phenomenon relates to a stress concentration factor Kc on a stacked layer. Typically, when the stress concentration factor on a stacked layer is large, the lifting phenomenon may occur due to a low interfacial bonding force. However, when the stress concentration factor is small on the stacked layer, the lifting phenomenon may not occur due to a high interfacial bonding force. In addition, the stress concentration factor is proportional to a square root of the stress applied to a film multiplied by a thickness thereof and the total stress concentration factor of a stacked layer is a sum of the respective stress concentration factors on each layer. The stress concentration factor is represented by a formula as follows.

$$Kc = \Omega \times stress \times thickness\ 2\ (\Omega = 1.46)$$  [Formula 1]

The following Table 1 shows stresses and stress concentration factors on an amorphous carbon film and a tungsten layer formed by a Chemical Vapor Deposition (hereinafter referred to as "CVD"), respectively, and a stress concentration factor on stacked layers formed by stacking them, according to the prior art. In addition, FIG. 1 is a sectional view showing the aforementioned-stacked layer.

TABLE 1

| Film | Thickness (Å) | Stress (dyn/cm²) | $K_c$ (MPa/m$^{0.5}$) |
|---|---|---|---|
| Amorphous carbon film | 1500 | 9.00e8 | 0.051 |
| CVD tungsten film | 800 | 1.5e10 | 0.619 |
| Total $K_c$ on the Stacked layer | | | 0.67 |

Generally, the CVD tungsten film that is used as a metal wire of a flash memory has a large tensile stress of 2000 MPa (2e10 dyn/cm2) and the amorphous carbon film has a large tensile stress of 90 MPa (0.9e9 dyn/cm²) at a forming temperature of 550° C. Therefore, when an amorphous carbon film is formed over a CVD tungsten film to form a metal wire of a flash memory, two layers having large tensile stresses, respectively, are stacked. As a result, as shown in Table 1, the stress concentration factor becomes relatively large and thus a lifting phenomenon occurs on an interface, as shown at portion A of FIG. 1.

To solve the problem of a lifting phenomenon occurring on an interface, a tungsten film formed by Physical Vapor Deposition (hereinafter referred to as "PVD"), rather than CVD tungsten film having a large tensile stress, has been used.

The following Table 2 shows stresses and stress concentration factors on an amorphous carbon film, a PVD tungsten layer, and PE nitride film (Plasma Enhanced nitride), respectively, and a stress concentration factor on stacked layers formed by stacking them. In addition, FIG. 2 is a sectional view showing the aforementioned-stacked layer.

TABLE 2

| Film | Thickness (Å) | Stress (dyn/cm²) | $K_c$ (MPa/m$^{0.5}$) |
|---|---|---|---|
| Amorphous carbon film | 2000 | 9.00e8 | 0.059 |
| PE nitride film | 300 | −2.60e9 | −0.066 |
| PVD tungsten film | | 5.00e9 | 0.206 |
| Total $K_c$ on the Stacked layer | | | 0.199 |

Referring to Table 2, since the value of a stress concentration factor on the stacked layer formed, as the aforementioned way is relatively small, a lifting phenomenon does not occur, as shown in FIG. 2. However, since a burial step of a metal contact is difficult when a PVD tungsten film is used, in order to perform a step of using a PVD tungsten film, a prior CVD tungsten film is buried to form a metal contact and then a metal wire is formed using PVD tungsten. Accordingly, the numbers of steps increase to become complicate in using PVD tungsten.

SUMMARY OF THE INVENTION

To solve the problem, the invention provides a method of fabricating a semiconductor device in which a tensile stress on an etched layer or an amorphous carbon film can be reduced in forming an amorphous carbon film, or a compression stress film is formed between the etched layer and the amorphous carbon film and thus a lifting phenomenon can be prevented from occurring.

A method of fabricating a semiconductor device according to one embodiment of the invention includes the steps of forming an etched film on a semiconductor substrate, and forming an amorphous carbon film on the etched film, wherein when the etched film has a tensile stress, the amorphous carbon film has a compression stress.

The amorphous carbon film is preferably formed at 100° C. to 400° C.

A method of forming a semiconductor device according to another embodiment of the present invention may comprise the steps of forming an etched layer having a tensile stress on a semiconductor substrate, depositing an amorphous carbon film on the etched layer, and performing a heat treatment to eliminate the tensile stress on the etched layer.

The heat treatment is preferably performed under an argon atmosphere at 300° C. to 500° C. for 0.5-2 hours.

The heat treatment is preferably performed under an argon atmosphere at 300° C. to 500° C. for one minute to 20 minutes through a Rapid Thermal Annealing process.

A method of forming a semiconductor device according to another embodiment of the invention may include the steps of forming an etched layer on a semiconductor substrate, forming a compression stress film having a predetermined compression stress on the etched layer, and depositing an amorphous carbon film on the compression stress film, wherein the tensile stress on the amorphous carbon film can be reduced due to the compression stress on the compression film.

The compression stress film preferably forms at least one of a PE nitride film, oxide, SiON, and strontium oxide film (SROx).

The etch layer is preferably a conductive layer.

The conductive layer is preferably formed of one of CVD tungsten, aluminum, TiCl4-TiN, and polysilicon.

BRIEF DESCRIPTION OF THE DRAWINGS

The accompanying drawings, which are included to provide a further understanding of the invention and are incorporated in and constitute a part of the disclosure, illustrate embodiments of the invention and together with the description serve to explain the principles of the invention. In the drawings.

DESCRIPTION OF SPECIFIC EMBODIMENTS

Reference will now be made in detail to the preferred embodiments of the invention, examples of which are illustrated in the accompanying drawings.

In the following, an embodiment of the invention will be described.

In a typical NAND flash memory process, a gate electrode is formed of a tungsten silicide (WSi), etc. and a nitride film and an interlayer insulation film are formed thereover and a stacked layer of a metal wire/a barrier metal layer and then a hard mask film is formed of a nitride film and an oxidation film, etc. At this time, when a PE-TEOS film is formed of the inter layer insulation film and a stacked layer of CVD tungsten film/Ti—TiN film is formed of the stacked layer, a lifting phenomenon occurs on the CVD tungsten film and the CVD tungsten film due to a tensile stress of the CVD tungsten film. Here, a stress concentration factor of the entire structure thereof is 0.67 MPa/m0.5.

Figure 1:
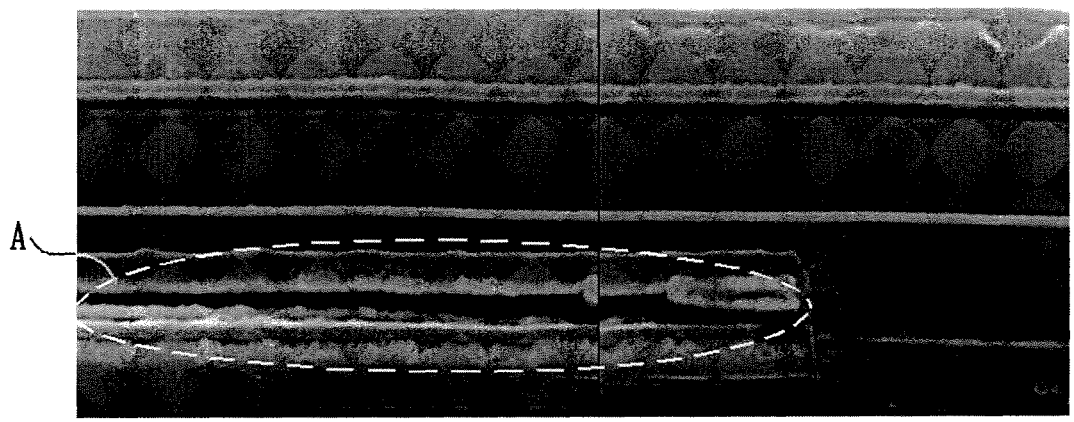
FIG. 1 is a sectional view showing an amorphous carbon film and a CVD tungsten film formed according to the prior art.
Figure 2:
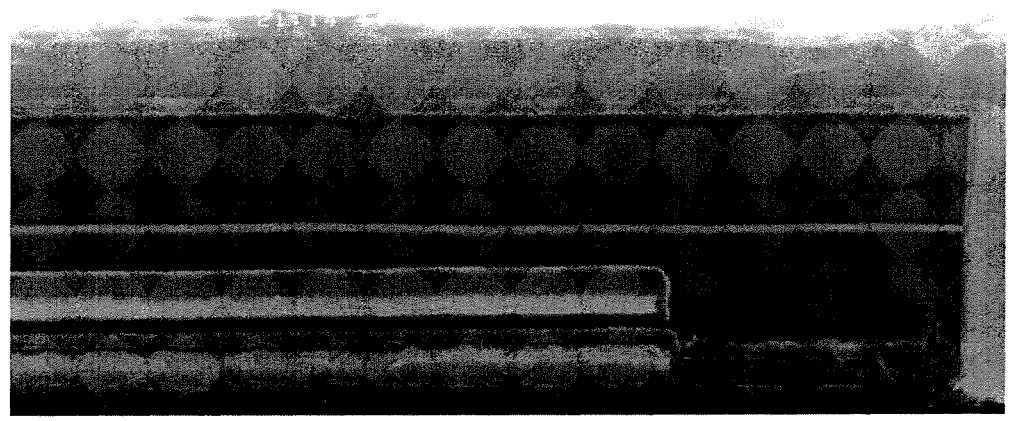
FIG. 2 is a sectional view showing a PVD tungsten film, a PE nitride film and an amorphous carbon film formed according to the prior art.
Figure 3:
FIG. 3 is a sectional view showing a semiconductor device including a stacked layer of a HDP oxidation film, a CVD tungsten film and Ti—TiN film.

Meanwhile, when the inter layer insulation film is formed of a HDP (High Density Plasma) oxidation film and a stacked layer of CVD tungsten film/Ti—TiN film is formed of the stacked layer, as shown in FIG. 3, a lifting phenomenon does not occur on the CVD tungsten film and the Ti—TiN film. At this time, a stress concentration factor of the entire structure thereof is 0.49 MPa/m0.5. Here, it is taught that when the stress concentration factor is large, the lifting phenomenon may occur, and that when the stress concentration factor is equal to or less than 0.49 MPa/m0.5, the lifting phenomenon does not occur on the CVD tungsten film.

Accordingly, when a stacked layer is formed by stacking films having tensile stress and further the tensile stress are reduced for the stress concentration factor of the stacked layer to be equal to or less than 0.49 MPa/m0.5, the lifting phenomenon is prevented from occurring. For this purpose, when an amorphous carbon film is stacked over an etched layer having a tensile stress, as a hard mask and a reflection preventing film, the tensile stress of the amorphous carbon film and the etched layer is to reduce, or a compression stress film having a compression stress is formed between the stacked layers and thus the lifting phenomenon can be prevented. Here, the etched layer is formed as a conductive layer; preferably, it may be one of CVD tungsten, aluminum, TiCl4-TiN and polysilicon.

Details of this embodiment will be as follows.

Embodiment 1

An amorphous carbon film having a compression stress is formed. Typically, the amorphous carbon film has a tensile stress of about 90 MPa at a forming temperature of 550° C. Here, when the amorphous carbon film is formed at below this temperature, preferably, 100° C.-400° C., the amorphous carbon film has a compression stress. For example, the amorphous carbon film is formed at 300° C., it has a tensile stress of about 330 MPa.

Accordingly, when an amorphous carbon film is formed over the etched layer, the amorphous carbon film is formed at a range of 100° C. to 400° C. and thus a lifting phenomenon on a stacked layer can be prevented. The following Table 3 shows stresses and stress concentration factors on a CVD tungsten film and an amorphous carbon film formed at 300° C., respectively, and a stress concentration factor on stacked layers formed by stacking them.

TABLE 3

| Film | Thickness (Å) | Stress (dyn/cm$^2$) | $K_c$ (MPa/m$^{0.5}$) |
|---|---|---|---|
| Amorphous carbon film | 2000 | −3.30e+09 | −0.215 |
| CVD tungsten film | 800 | 1.50e+10 | 0.619 |
| Total $K_c$ on the Stacked layer | | | 0.404 |

Referring to Table 3, the stress concentration factor on the stacked layer is 0.404 MPa/m0.5, and thus a lifting phenomenon does not occur.

Embodiment 2

To reduce a tensile stress on an etched layer, a heat treatment process against the etched layer is performed. The heat treatment process for reducing a tensile stress on the etched layer is performed under an argon atmosphere at 300° C. to 500° C. for 0.5 hours to two hours, or under argon atmosphere at 300° C.-500° C. for one minute to 20 minutes through a Rapid Thermal Annealing process.

Embodiment 3

A film having a compression stress is formed between a stacked layer of an etched layer and an amorphous carbon film. The film having a compression stress includes a Plasma Enhanced nitride film, an oxide film, SiON film and a strontium oxide film (SrOx), etc. The following Table 4 shows stresses and stress concentration factors on a CVD tungsten film, an amorphous carbon film, and a PE nitride film respectively, and a stress concentration factor on stacked layers formed by stacking the PE nitride film between the CVD tungsten film and the amorphous carbon film.

TABLE 4

| Film | Thickness (Å) | Stress (dyn/cm$^2$) | $K_c$ (MPa/m$^{0.5}$) |
| --- | --- | --- | --- |
| Amorphous carbon film | 2000 | 9.00e+08 | 0.059 |
| PE nitride film | 300 | −2.60+09 | −0.066 |
| CVD tungsten film | 800 | 1.5e+10 | 0.619 |
| Total $K_c$ on the Stacked layer | | | 0.338 |

Referring to Table 4, the stress concentration factor on the stacked layer is 0.038 MPa/m0.5, and thus a lifting phenomenon does not occur.

According to the method for fabricating a semiconductor device of the invention, when an amorphous carbon film is stacked as a hard mask and a reflection preventing film on a etched layer having a tensile stress, a lifting phenomenon does not occur and thus minute pattern can be formed. Accordingly, highly integrated and minute semiconductor can be fabricated.

What is claimed is:

1. A method of fabricating a semiconductor device comprising the steps of:
   forming a first film having a tensile stress on a semiconductor substrate; and
   forming an amorphous carbon film having a compression stress on the etched first film having a tensile stress,
   wherein the amorphous carbon film forms a hard mask, and the first film having the tensile stress is a conductive layer.

2. A method of fabricating a semiconductor device according to claim 1, comprising forming the amorphous carbon film at 100° C. to 400° C.

3. A method of fabricating a semiconductor device comprising the steps of:
   forming an etched layer having a tensile stress on a semiconductor substrate;
   depositing an amorphous carbon film on the etched layer; and
   performing a heat treatment to eliminate the tensile stress on the etched layer.

4. A method of fabricating a semiconductor device according to claim 3, comprising performing the heat treatment under an argon atmosphere at 300° C. to 500° C. for 0.5 hours to two hours.

5. A method of fabricating a semiconductor device according to claim 3, comprising performing the heat treatment under an argon atmosphere at 300° C. to 500° C. for one minute to 20 minutes through a Rapid Thermal Annealing process.

6. A method of fabricating a semiconductor device according to claim 3, wherein the etched layer is a conductive layer.

* * * * *